(12) United States Patent
Nakai

(10) Patent No.: US 6,370,212 B1
(45) Date of Patent: Apr. 9, 2002

(54) METHOD AND DEVICE FOR DECODING MANCHESTER ENCODED DATA

(75) Inventor: Junji Nakai, Tokyo (JP)

(73) Assignee: Oki Electric Industry Co., Ltd. (JP)

( * ) Notice: Subject to any disclaimer, the term of this patent is extended or adjusted under 35 U.S.C. 154(b) by 0 days.

(21) Appl. No.: 09/305,303

(22) Filed: May 5, 1999

(30) Foreign Application Priority Data

May 20, 1998 (JP) .......................................... 10-138089

(51) Int. Cl.[7] .............................. H04L 7/02; H03M 7/12
(52) U.S. Cl. ........................................ 375/359; 341/70
(58) Field of Search ................................ 375/359, 360, 375/361; 341/70, 68, 69, 71, 72

(56) References Cited

U.S. PATENT DOCUMENTS

| | | | | |
|---|---|---|---|---|
| 5,103,466 A | * | 4/1992 | Bazes | .......................... 375/361 |
| 5,446,765 A | * | 8/1995 | Leger | .......................... 375/359 |
| 5,566,212 A | * | 10/1996 | Boytim et al. | ............... 375/333 |
| 5,696,800 A | * | 12/1997 | Berger | .......................... 375/361 |
| 5,812,619 A | * | 9/1998 | Runaldue | .................... 375/376 |
| 5,835,542 A | * | 11/1998 | Lu | .............................. 375/359 |
| 6,188,738 B1 | * | 2/2001 | Sakamoto et al. | .......... 375/371 |

* cited by examiner

*Primary Examiner*—Chi Pham
*Assistant Examiner*—Khai Tran
(74) *Attorney, Agent, or Firm*—Venable; Robert J. Frank; Jeffri A. Kaminski

(57) ABSTRACT

In a Manchester encoded data decoder a clock component is extracted from input data inputted at a prescribed rate, the extracted clock component is taken as input and transition points are extracted from the signal waveform of the filter output, a clock signal of the same rate as the input data and which is in synchronism with the phase of the extracted transition points is generated, a data component is extracted from the input data, results of comparing the extracted data component and a prescribed value are outputted as a binary level signal; and the binary level signal, taken in using the clock signal, is outputted as NRZ encoded data corresponding to the input data.

9 Claims, 10 Drawing Sheets

DEMO: input data (1Mbps)
(Manchester encoded data)
MCLK: main clock (64MHz)
RXC: transition point-synchronized internal clock (1MHz)
RXD: data decoded for Manchester encoded data (NRZ data: 1 Mbps)

FIG. 2 [Prior Art]

(A) input data (NRZ encoded data)
(B) input data (Manchester encoded data)
(C) count value for 11a3

(A) input data (NRZ encoded data)
(B) input data (Manchester encoded data)
(C) count value for 11a3
(D) transion point extracted signal DIS

METHOD AND DEVICE FOR DECODING MANCHESTER ENCODED DATA

BACKGROUND OF THE INVENTION

1. Field of the Invention

The present invention relates to a device for decoding Manchester encoded data and more particularly relates to technology for decoding Manchester encoded data to NRZ (Non Return Zero) encoded data.

2. Description of Related Art

In Manchester code, code of a rectangular wave pattern "10" is assigned to the binary number "1" and the rectangular waveform "10" takes the bit period of the binary number "1" as one period. Manchester code also assigns a rectangular waveform "01" to the binary number "0", with the rectangular waveform for the binary number "0" having a phase difference of 180 degrees with respect to the rectangular waveform for the binary number "1".

When binary data (NRZ encoded data) is decoded from Manchester encoded data, a decoding device detects information for one of the leading half or the following half of the bit period of the Manchester encoded data. If this information can be detected, the decoding device can decode whether the Manchester encoded data is a binary "1" or "0".

Related devices regenerate a decoding clock from transition points of the Manchester encoded data and then synchronize the phase of the regenerated clock with the transition points of the Manchester encoded data. After the regenerated clock is synchronized, the related device generates a clock of a timing corresponding to one of the leading half or following half of the bit period of the Manchester encoded data. The related device then obtains decoded data by extracting information appearing at the timing of the generated clock.

For example, FIG. 2 shows a method for decoding Manchester encoded data employed in the related art.

FIG. 2 shows the flow of data when decoded data is obtained from the following half of the bit period for Manchester code transmitted by a related device at 1 Mbps.

FIG. 2(A) shows 1 Mbps NRZ data ("1", "0", "1", "1", "0", "0", "1"). FIG. 2(B) shows Manchester encoded data ("10 ", "01", "10", "10", "01", "01", "10 (where 0 is not shown in the drawings)"). FIG. 2(C) shows regenerated clock data (12 clock portion). FIG. 2(D) shows decoded data 1 ("1", "1", "0", "0", "1", "1") obtained from data for the Manchester encoded data of FIG. 2(B) and data for the regenerated clock of FIG. 2(C). The phase of the decoded data 1 is ¾ of a period behind when compared with the phase of the NRZ data of FIG. 2(A). FIG. 2(E) shows decoded data 2 ("0", "1", "0", "1", "1", "0", "0") 180 degrees out of phase with the phase of the decoded data 1 of FIG. 2(D).

When decoded data is obtained, the related device phase synchronizes a regenerated clock having twice the frequency (2 MHz) of the Manchester encoded data with the Manchester encoded data. After the phase of the regenerated clock is synchronized with the transition points of the Manchester encoded data, the related device selects a clock timing corresponding to the following half of the bit period of the clock timings of two types of parity comprising the regenerated clock. The related device then samples the Manchester encoded data at the selected clock timing and takes the sampled data as decoded data.

FIG. 2(C) shows where a clock corresponding to the following half of the bit period is an even numbered clock. The related device then selects the even numbered clock as a sampling clock. FIG. 2(D) shows the results for the sampling clock. The results for the sampling clock are the decoded data 1. FIG. 2(E) shows the decoded data 1 with it's polarity inverted. In reality, the related device obtains the polarity inverted data as the final decoded data 2.

Manchester code is characterized by values being of inverted polarities at the leading and following halves of the bit period. As a result of having this property, when the related device makes an erroneous sampling clock selection, the Manchester code is such that the polarity of the obtained decoded data is inverted.

In an actual circuit, it is necessary to separately provide a circuit for accurately discerning odd and even numbers of the regenerated clock.

When the Manchester encoded data is consecutive 1's or 0's the related device extracts the transition points for the rectangular waveform appearing at these continuous portions. The related device cannot, however, determine odd and even numbers of regenerated clocks from the extracted transition points. In this case, the transition points are not just boundaries of the bit periods. The related device therefore has to add special bit strings, from a few to several tens of bits to the data.

SUMMARY OF THE INVENTION

It is the object of the present invention to take into consideration the above problems and therefore to provide technology where it is no longer necessary to use a specific bit string in order to decide upon odd or even Manchester encoded data. To achieve this object, the present invention therefore provides technology in such a manner that a specific circuit does not have to be used in order to decide upon odd or even Manchester encoded data and provides technology capable of decoding Manchester encoded data to NRZ encoded data.

In order to resolve the aforementioned problems, in the present invention a method for decoding Manchester encoded data is provided with the following steps.

Extracting a clock component from input data inputted at a prescribed rate;

taking the extracted clock component as input and extracting transition points from the signal waveform of the clock component;

generating a clock signal of the same rate as the input data, that is in synchronism with the phase of the extracted transition points;

extracting a data component from the input data;

outputting results of comparing the extracted data component and a prescribed value as a binary level signal; and outputting the binary level signal, taken in using the clock signal, as NRZ encoded data corresponding to the input data.

In order to resolve the aforementioned problems, in the present invention, a Manchester encoded data decoding device is provided with the following.

A Manchester encoded data decoding device comprising:

a first low pass filter for extracting a clock component from input data inputted at a prescribed rate;

a transition extractor for taking the extracted clock component as input and extracting transition points from the signal waveform of the clock component;

a clock generator for generating a clock signal of the 1 MHz, that is in synchronism with the phase of the extracted transition points;

a second low pass filter for extracting a data component from the input data;

an encoder for outputting results of comparing the extracted data component and a prescribed value as a binary level signal; and a decoder for outputting the binary level signal, taken in using the clock signal, as NRZ encoded data corresponding to the input data.

Further, the filter output of the first low pass filter is the integrated waveform of the clock component. The transition points of the integrated waveform then appear in the vicinity of ½ time slots where the polarity of the Manchester code is inverted. The filter output of the second low pass filter is the integrated waveform for the data component. Information for the leading half portion of the time slot for the integrated waveform therefore appears as an extremely large value or an extremely small value in the vicinity of the ½ time slot where the polarity of the Manchester code is inverted.

The technology for the present invention takes out a binary level signal constituting the results of comparing a filter output of the second low pass filter occurring at timings of a regenerated clock signal and a prescribed value, using the regenerated clock signal. The technology of the present invention therefore reflects information for the leading half of the corresponding time slot and is capable of decoding Manchester encoded data to NRZ encoded data.

DETAILED DESCRIPTION OF THE PREFERRED EMBODIMENTS

A device for decoding Manchester encoded data constituting an embodiment of the present invention is described in the following with reference to the appended drawings.

Figure 1:
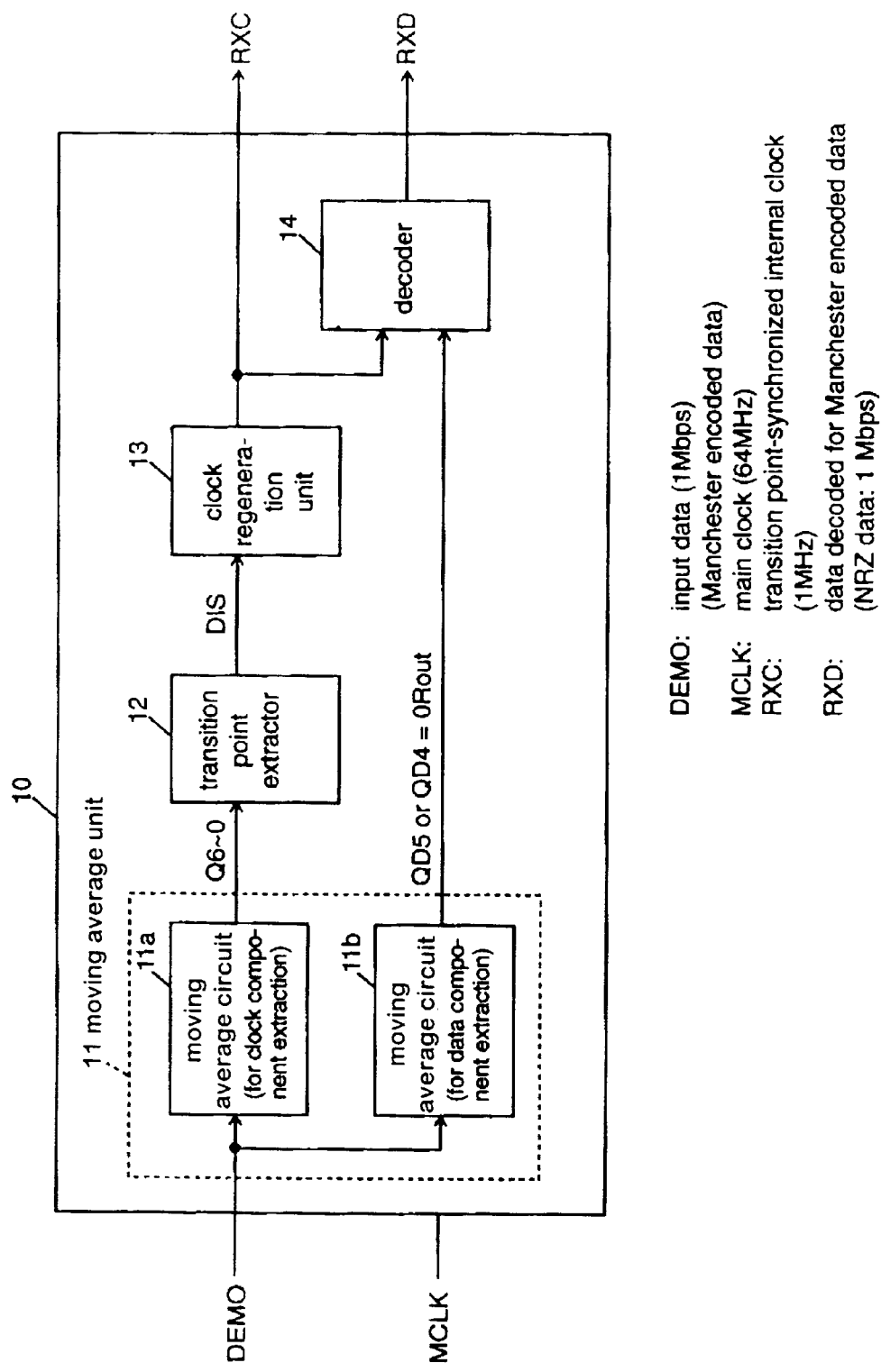
FIG. 1 is a block view showing the overall configuration of a device for decoding Manchester encoded data constituting an embodiment of the present invention.
Figure 2:
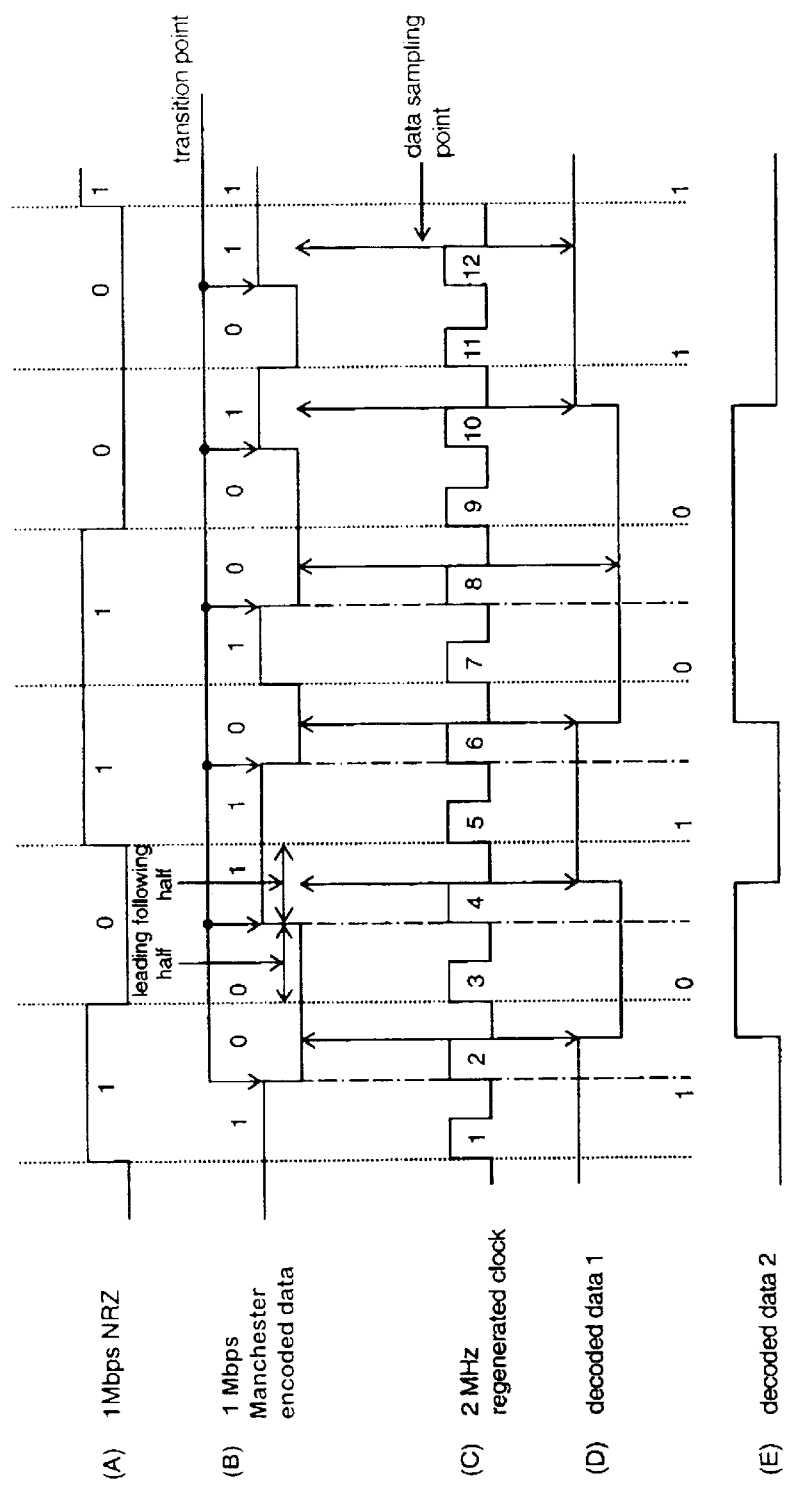
FIG. 2 is a timing chart showing related decoding theory.

FIG. 1 shows the overall configuration of the device for decoding the Manchester encoded data constituting a preferred embodiment of the present invention and shows the overall configuration of the device in a functional manner. Here, a Manchester encoded data decoding device 10 comprises a moving average unit 11, transition point extractor 12, clock regeneration unit 13 and a decoder 14.

The moving average unit 11 is a circuit for calculating and outputting two types of transition averages from the input data DEMO. The moving average unit 11 comprises two moving average circuits 11$a$ and 11$b$, with the moving average circuits 11$a$ and 11$b$ each functioning as a low pass filter. The moving average circuit 11$a$ functions as a clock component extraction circuit and the moving average circuit 11$b$ functions as a data component extraction circuit. Each circuit removes frequency components other than the characteristics pass bands and outputs the output component in digital form. The cut-off frequency for deciding the pass bands of each circuit is set to a value slightly lower than the frequency band taken as the extraction target so that the outputted waveform is triangular.

At the moving average circuit 11$a$ for clock component extraction, the extracted clock component waveform is ecpressed as a bit string of recurring 0's and 1's. The transition point extractor 12 extracts transition points of the extracted clock component waveform and outputs the extracted transition points as a transition point extraction signal DIS. When there is no distortion, transition points appear at the central positions of the bit periods of the Manchester code.

The clock regenration unit 13 is for synchronizing the phase of an internally regenerated clock of the 1 MHz with the phase of the transition point extraction signal. The clock regenration unit 13 is constructed from a PLL circuit. The regenerted clock is outputted as a transition point-synchronized internal clock RXC.

The decoder 14 obtains a decoded signal data RXD. In order to obtain the decoded signal data RXD, the decoder 14 takes an output ORout of the moving average circuit 11$b$ at a prescribed clock timing using the transition point-synchronized internal clock RXC. The output ORout appears as information phase-shifted by ¼ of a period from the phase of the input data (described in detail later) and the decoder 14 therefore captures the output ORout using the transition point-synchronized internal clock RXC having a synchronous relationship with the central position of the bit period. The decoder 14 then takes in information for the leading half of the bit period using the captured output ORout.

The configuration of each part of the configuration for the device for decoding the Manchester encoded data is now described in detail in the following with reference to the drawings.

(a) Configuration of the Moving Average Unit 11

Figure 3:
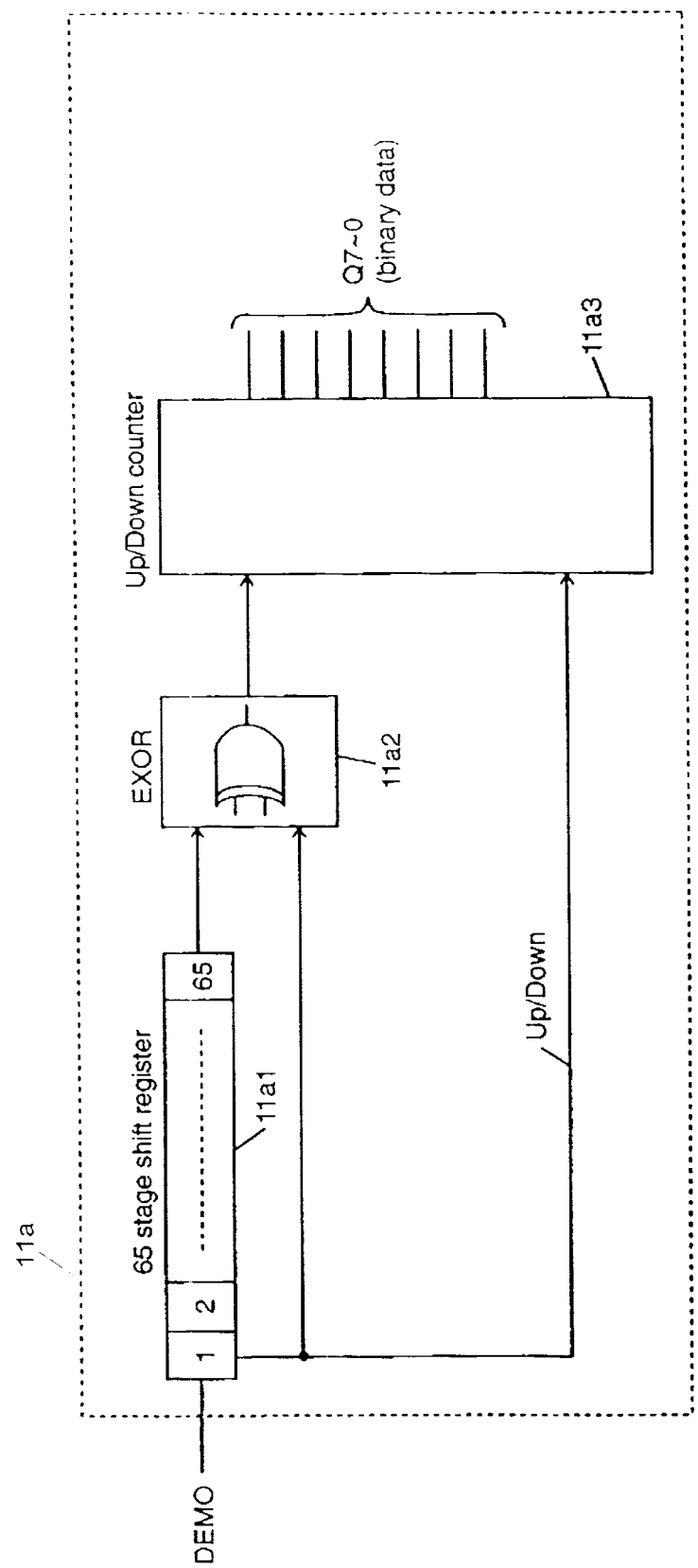
FIG. 3 is a block diagram showing a configuration of a moving average circuit (for clock component extracting use) of the embodiment of the present invention.
Figure 4:
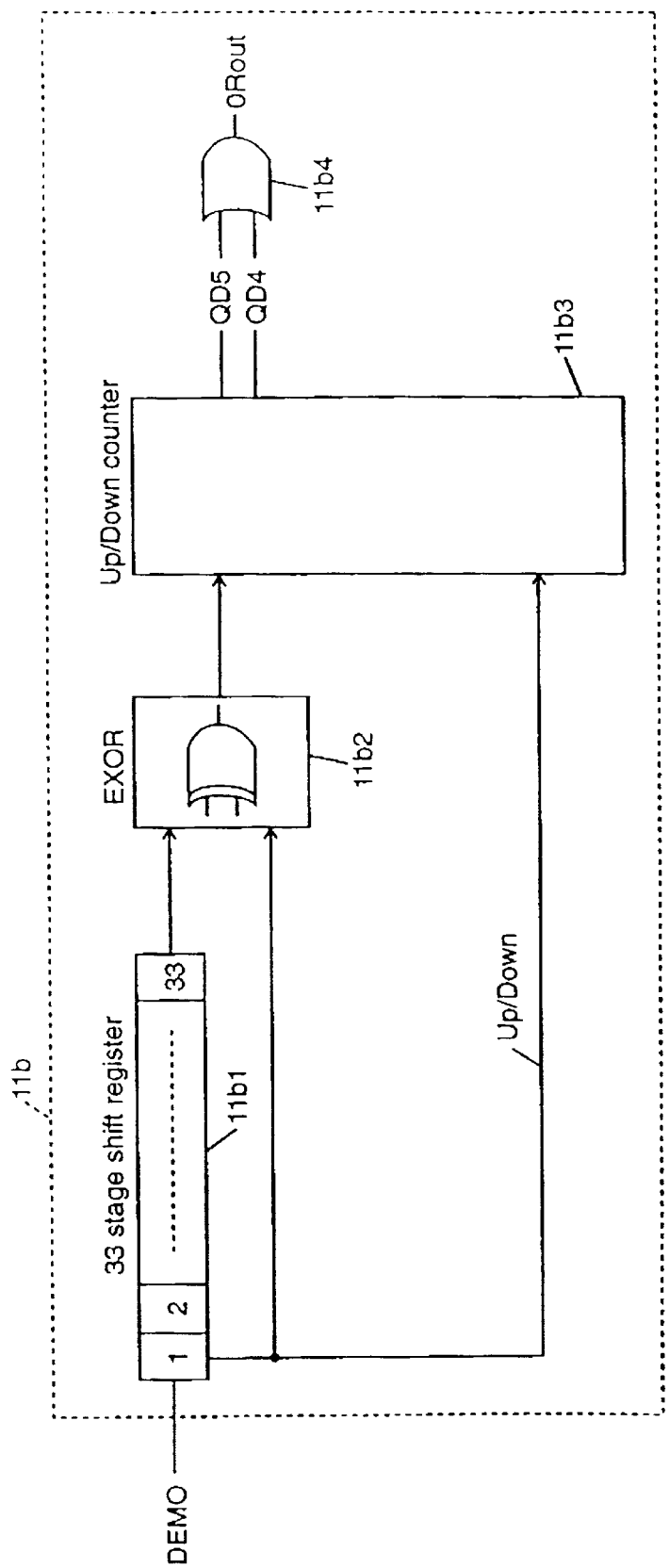
FIG. 4 is a block diagram showing a configuration of a moving average circuit (for data component extraction use) of the embodiment of the present invention.

Referring to FIG. 1, the moving average unit 11 comprises two moving average circuits, the moving average circuit 11$a$ for clock component extraction and the moving average circuit 11$b$ for data extraction use. FIG. 3 shows the internal configuration of the moving average circuit 11$a$ and FIG. 4 shows the internal configuration of the moving average circuit 11$b$.

(a-1) Moving Average Circuit 11$a$

FIG. 3 shows the internal configuration of the moving average circuit 11$a$. The moving average circuit 11$a$ comprises a shift register 11$a$1, an "exclusive OR circuit" (hereinafter abbreviated to "EX-OR") 11$a$2 and an up/down counter 11$a$3.

Referring to FIG. 3, the shift register 11$a$1 is a 65 stage shift register. The 65 stage shift register provides a one bit period phase difference between the register value outputted from the first stage of the shift register 11a1 and the register value outputted from the final stage. The 65 stage shift register is therefore provided to obtain the transition average across the phase difference to the bit period which is a unit of the bit period of Manchester encoded data.

For example, FIG. 3 shows an example where the transmission speed of the input data is taken to be 1 Mbps and the main clock MCLK is taken to be 64 MHz. As the bit period of the input data can then be calculated to be [64] using the main clock, the value [65] can be used as a number of stages of the shift register. The number of stages for the shift register 11a1 can be changed in accordance with an appropriate system.

The EX-OR 11a2 receives the register value of the first stage and the register value of the $65^{th}$ stage of the shift register 11a1 as input. The EX-OR 11a2 takes a value for one cycle previous of the received Manchester encoded data and a current value and obtains the exclusive OR result for these inputs.

The moving average circuit 11a therefore obtains a fixed relationship between the value for one period previous and the current value by obtaining the exclusive OR of the value for one cycle previous and the current value. The fixed relationship is, from the characteristics of Manchester encoding, that the inputted data is consecutive identical values (i.e. consecutive 1's or 0's) or the clock component (i.e. appearing as alternate 1's or 0's).

In the case of consecutive 1's and 0's, as the same bit pattern is consecutive, the values for one period previous and the current value are the same. In the case such as the clock component where there is a bit string appearing as alternate 1's and 0's, the value for one period previous and the current value are values of exactly opposite polarities.

The EX-OR 11a2 outputs "1" as an exclusive OR result when the same pattern as for the clock component appears. The EX-OR 11a2 outputs "0" when a different pattern to the clock component appears.

The up/down counter 11a3 is set to count up when the value for the first stage register of the shift register 11a1 is "1" and is set to count down when the value of the first stage register of the shift register 11a1 is "0". With the combination of the rectangular waveform pattern constituting ½ a bit of the Manchester encoded data, portions where "00" or "11" are repeated are clock portions. The count value of the clock portion has a period that is twice the period of the bit period and the wave-shape of the count value of the clock portion is a triangular shaped waveform that is convex at the top and bottom.

(a-2) Moving Average Circuit 11b

FIG. 4 shows an internal configuration of the moving average circuit 11b.

The moving average circuit 11b comprises a shift register 11b1, exclusive OR (EX-OR) 11b2, up/down counter 11b3, and OR circuit 11b4.

Referring to FIG. 4, the shift register 11b1 is a 33 stage shift register. The 33 shift register provides a phase difference of half a period between the register value outputted from the first stage of the shift register 11b1 and the register value outputted from the final stage. The 33 stage shift register also obtains the transition average across a phase difference of half a period, which is a unit of the bit period of Manchester encoded data.

FIG. 4 shows an example of when the transmission rate of the input data is taken to be 1 Mbps and the main clock MCLK is taken to be 64 MHz. The number of stages of the shift register can differ in accordance with an appropriate system as with the moving average circuit 11a.

The EX-OR 11b2 takes the register value of the first stage of the shift register 11b and the register value of the $33^{rd}$ stage as input. The EX-OR 11b2 takes a value for the previous half of the received Manchester encoded data and the current value as input and obtains the exclusive OR result.

The moving average circuit 11b obtains a fixed relationship between the value for one period previous and the current value by obtaining the exclusive OR of the value for one period previous and the current value. The fixed relationship is, from the characteristics of Manchester encoding, that the inputted data is consecutive identical values (i.e. consecutive 1's or 0's) or the clock component (i.e. appearing as alternate 1's or 0's).

In the case of consecutive 1's or 0's, the bit pattern of the previous half period is always different. In the case such as the clock component where there is a bit string appearing as alternate 1's and 0's, the value for the previous half period and the current value are of the same polarity at a constant period.

The EX-OR 11b2 outputs "0" at the period of the half period where "11" or "00" appear in combination as the rectangular waveform as the exclusive OR result. The EXOR 11b2 outputs "1" in the period of the half period when values differing from "11" or "00". appear in combination for the rectangular waveform.

The up/down counter 11b3 counts 1's outputted from the EX-OR 11b2 and converts counted values to 8-bit digital values (Q0 to Q7).

The up/down counter 11b3 is set to count up when the value for the first register of the shift register 11b1 is "1" and is set to count down when the value of the first stage register of the shift register 11b1 is "0". With the combination of the rectangular waveform pattern constituting ½ a bit of the Manchester encoded data, portions where "00" or "11" are repeated are then clock portions. The count value of the portion except the clock portion is then such that the bit values for the leading half and the following half of the bit period are of opposite polarities. The count value for the portion except the clock portion has the same period as the bit period and the wave-shape of the count value of the portion except the clock portion is a triangular shaped waveform that is convex at the top and bottom.

This means that a circuit consisting of the shift register 11b1 and the EX-OR 11b2 and the up/down counter 11b3 in combination operates as a low pass filter of a cut-off frequency fc=866 kHz.

The output of the up/down counter 11b3 is an 8-bit digital value (Q0 to Q7). The OR circuit 11b4 is a circuit for obtaining the OR result of the digital values QD4 and QD5 equivalent to the fifth and sixth bits of this output.

In obtaining the OR result of QD4 and QD5 constituting the digital values of the fifth bit and the sixth bit, information for data occurring at the current time slot appears at the bits for the digital values QD4 and QD5 at the edge timing. This edge timing is the edge timing of the transition point-synchronized internal clock RXC used during decoding and, as is described later, this edge timing is positioned approximately at the center of the time slot.

When the data at the current time slot is "1", the count value is increased. As a result of this operation, the count value occurring at the time where ¼ of a period or more of the time slot has passed is [16]d to [32]d (where d represents "decimal") (QD4 or QD5 are "1") regardless of the value of the previous time slot. On the other hand, when the data at the current time slot is "0", the count value is decreased. As a result of this down-counting operation, the count value occurring at the time where ¼ of a period or more of the time slot has passed is [0]d to [16]d (the values of QD4 and QD5 are both zero) regardless of the value of the previous time slot. If the value values of the bits QD4 and QD5 are detected with a proper point between ¼ of a period and ½ of a period of the time slot, the data value of the current time slot can be specified.

(b) Configuration of the Transition Point Extractor 12

Figure 5:
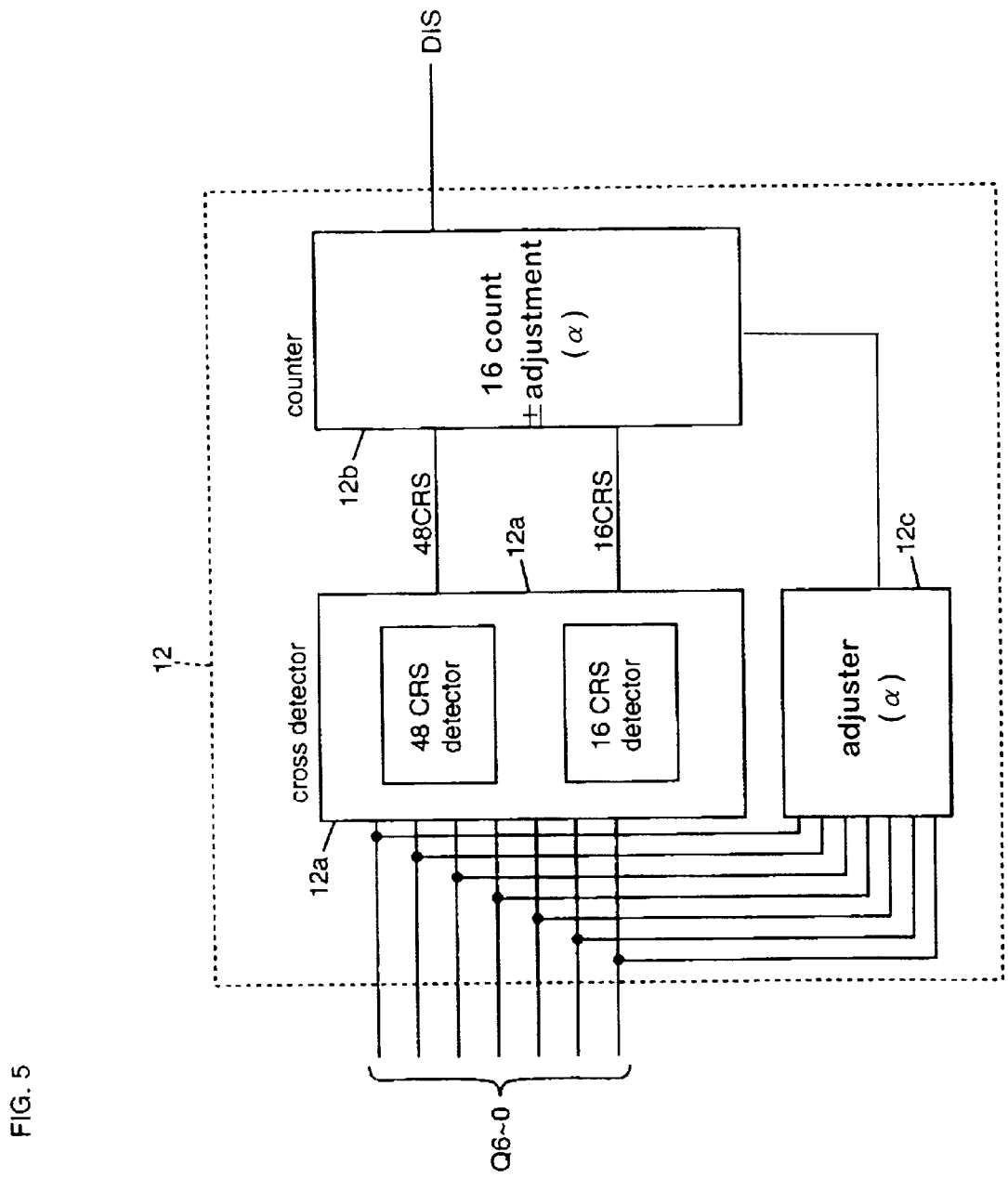
FIG. 5 is a block diagram showing a configuration for a transition point extractor of the embodiment of the present invention.

FIG. 5 shows the configuration of the transition point extractor 12. The transition point extractor 12 comprises a cross detector 12a, counter 12b, and adjuster 12c.

The cross detector 12a is provided with means for considering errors in the count value due to waveform deterioration and time required for the process of extracting the transition points.

Essentially, transition points constituting the object of detection are to appear at approximately the center of the time slots each count [64] corresponding to one bit period. In reality, there are cases where the timing at which the value of the transition point appears is shifted due to the influence of waveform deterioration etc. As an amount of time is required to extract the transition points, the cross detector 12a starts a process for waiting for detection of timing because of a delay in the following process.

As a result, the cross detector 12a decides upon ¼ of a period [16 clocks] as the margin for this purpose. The cross detector 12a is configured so as to detect [48]d or [16]d of the digital values (Q0 to Q7) supplied from the moving average circuit 11a as transition point extraction confirmation points. Detection of the transition point extraction confirmation points can be carried out using a detection signal and the detection signal is supplied to the counter 12b from the cross detector 12a.

The counter 12b counts 16 from the transition point extraction confirmation point. When the counter 12b counts 16, the counter 12b outputs the transition point extraction signal DIS.

The adjuster 12c obtains a shift α that appears at the output of the moving average circuit 11a due to the influence of waveform deterioration, etc. The adjuster 12c corrects the count value of the counter 12b by the amount of shift α. The shift α can be obtained as a shift with respect to the original maximum value and a shift with respect to the minimum value.

(c) Configuration of Clock Regeneration Unit 13

The clock regeneration unit 13 (FIG. 1) consists of a conventional digital PLL circuit. The clock regeneration unit 13 compares the phase of the transition point extraction signal DIS and the phase of a clock of internal dividing frequency. The clock regeneration unit 13 then outputs the results of carrying out correction corresponding to the difference in the compared phases as the transition point-synchronized internal clock RXC.

In this embodiment, the transmission rate of the input data is taken to be 1 Mbps and the clock frequency of the transition point-synchronized internal clock RXC for the input data can therefore be 1 MHz.

(d) Configuration of the Decoder 14

The decoder 14 (FIG. 1) comprises a conventional flip-flop. The decoder 14 takes in and holds the output ORout (OR result of QD5 and QD4) of the up/down counter 11b3 using the edge timing of the transition point-synchronized internal clock RXC constituting the output of the clock regeneration unit 13.

The decoder 14 receives the output ORout of the moving average circuit 11b and outputs decoded signal data RXD for the Manchester code.

(A-3) Decoding Operation

The decoding operation of the Manchester encoded data decoding device configured as a combination of each of the above parts is described using FIG. 6 to FIG. 10.

Figure 6:
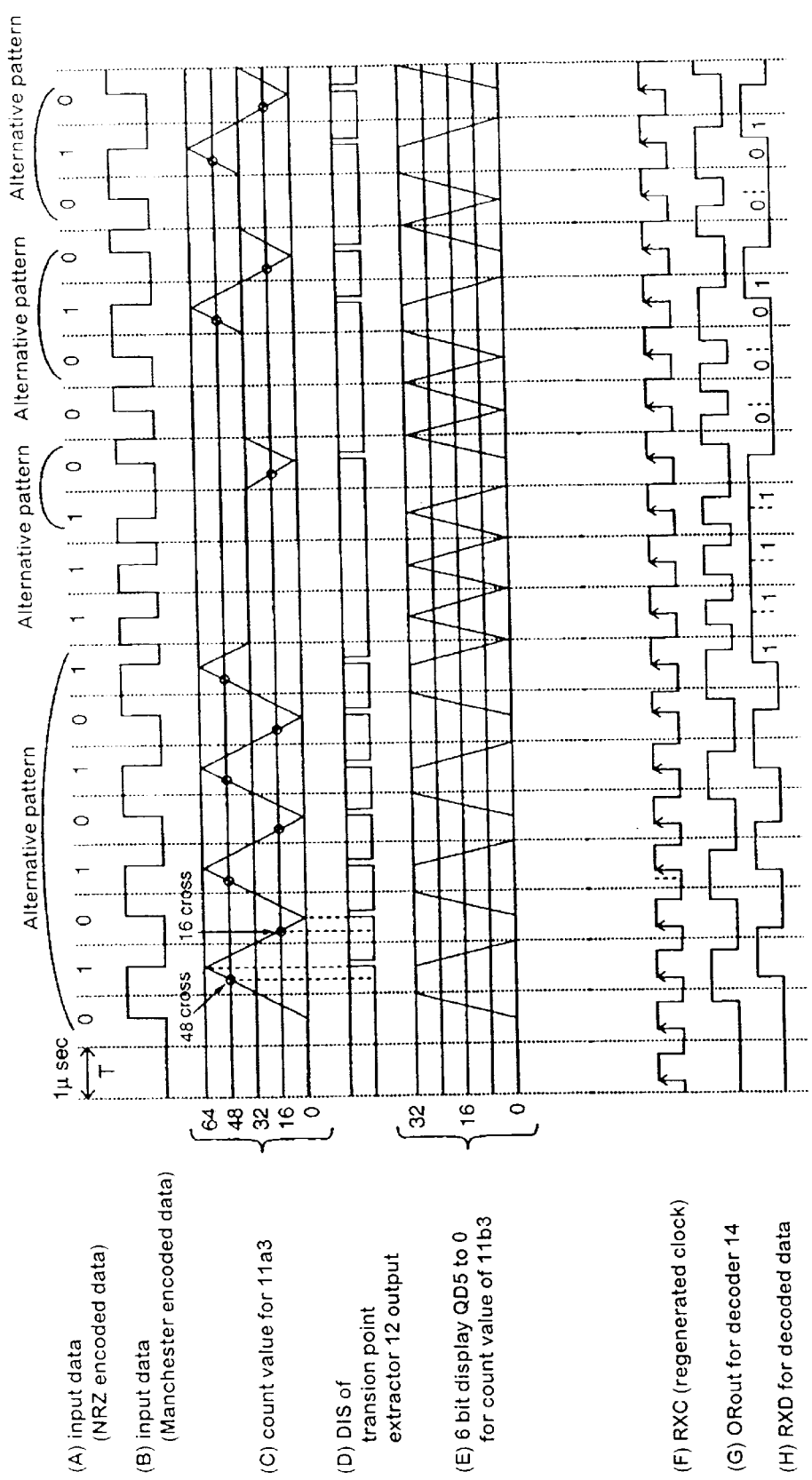
FIG. 6 is a timing chart showing a decoding operation for an entire device for the embodiment of the present invention.

FIG. 6 is a chart of the principal timing showing the decoding operation for the whole of the device for the first embodiment of the present invention.

FIG. 6(A) shows the input data "NRZ encoded data" for the device. FIG. 6(B) shows the input data "Manchester encoded data". FIG. 6(C) shows count value data of the up/down counter 11a3. FIG. 6(D) shows data for the transition point extraction signal DIS of the output of transition point extractor 12. FIG. 6(E) shows data for the values of the six-bit display QD5 to QD0 for the up/down counter 11b3. FIG. 6(F) shows data of the regenerated clock RXC. FIG. 6(G) shows data of ORout for the decoder 14. FIG. 6(H) shows data for RXD of the decoded data of FIG. 1.

FIG. 7 to FIG. 10 are timing charts illustrating the operation of the configuration where each of the parts of the first embodiment of the present invention are combined.

Figure 7:
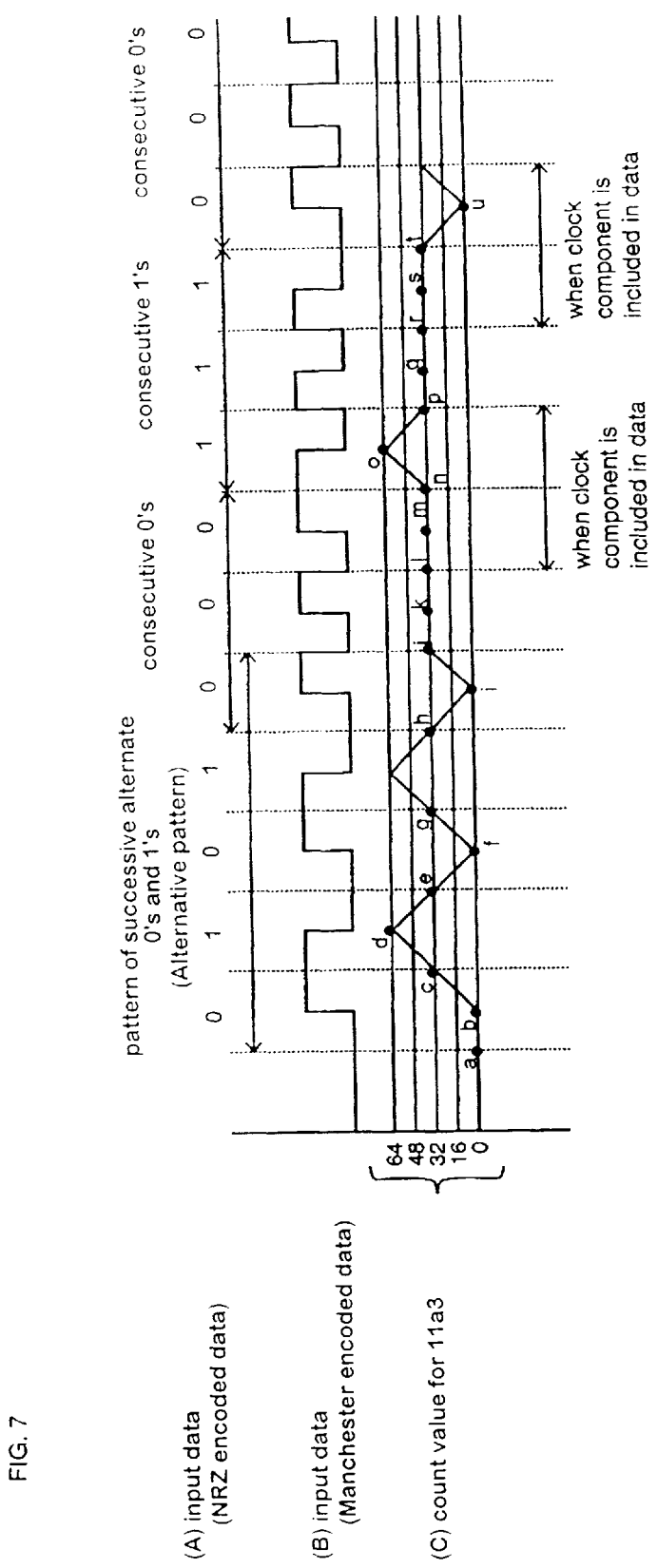
FIG. 7 is a timing chart showing a decoding operation for a moving average circuit (for clock component extraction) for the embodiment of the present invention.

FIG. 7 is a timing chart showing a decoding operation of the moving average circuit (for clock component extraction) constituting a first embodiment of the present invention. FIG. 7(A) shows input data and corresponds to the data of FIG. 6(A). FIG. 7(B) shows Manchester encoded data corresponding to the input data. FIG. 7(C) shows data for the count value of the up/down counter 11a3 and corresponds to the data of FIG. 6(C).

Figure 8:
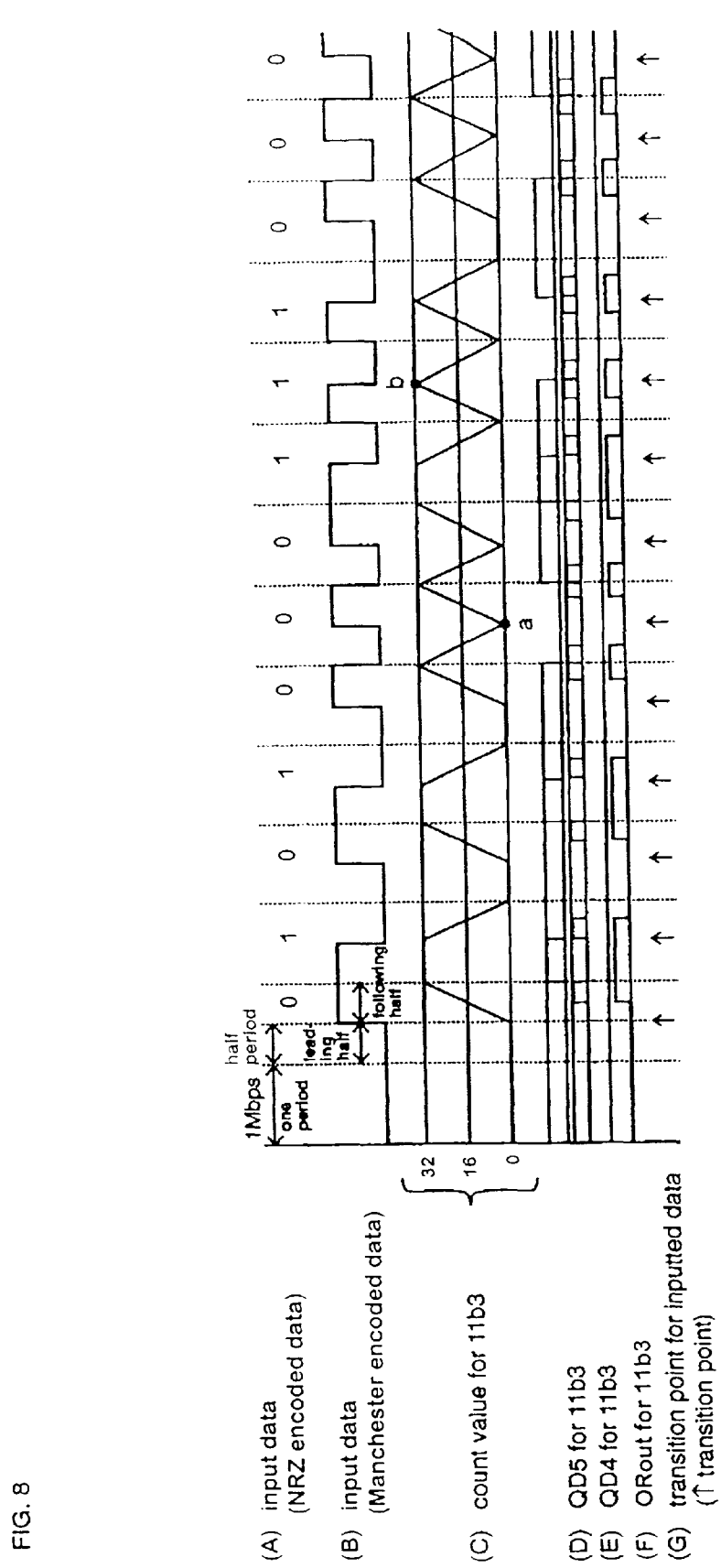
FIG. 8 is a timing chart showing a decoding operation for a moving average circuit (for data component extracting) for the embodiment of the present invention.

FIG. 8 is a timing chart showing the decoding operation of the moving average circuit (for data component extraction use) of the first embodiment of the present invention. FIG. 8(A) shows the input data and corresponds with the data of FIG. 6(A). FIG. 8(B) shows the Manchester encoded data corresponding to the input data and corresponds to the data for FIG. 6(B). FIG. 8(C) shows the data for the count value of the up/down counter 11b3 and corresponds to the data of FIG. 6(E). FIG. 8(D) shows the data for the value of QD5 of the up/down counter 11b3. FIG. 8(E) shows the data for the value of QD4 of the up/down counter 11b3. FIG. 8(F) shows the data for ORout of the OR circuit 11b4 and corresponds to the data for FIG. 6(G). FIG. 8(G) shows the data for the input data transition points.

Figure 9:
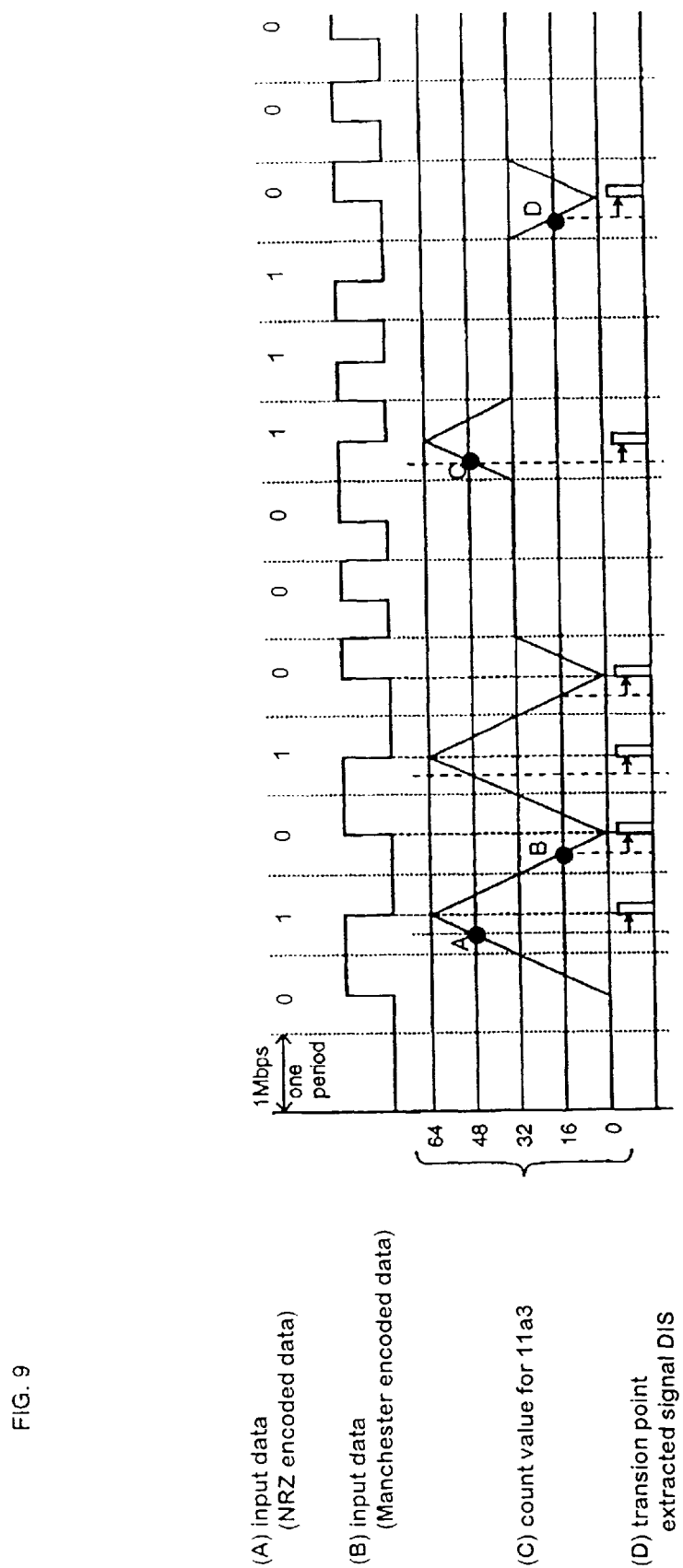
FIG. 9 is a timing chart showing an operation for extracting transition points at a transition point extractor of the embodiment of the present invention.

FIG. 9 is a timing chart showing the operation of extracting the transition points occurring at the transition point extractor of the first embodiment of the present invention. FIG. 9(A) shows the input data and corresponds to the data of FIG. 6(A). FIG. 9(B) shows Manchester encoded data corresponding to the input data and corresponds to the data of FIG. 6(B). FIG. 9(C) shows the data for the count value of the up/down counter 11a3 and corresponds to the data for FIG. 6(C). FIG. 9(D) shows the data for the transition point extraction signal DIS of the output of transition point extractor 12 and corresponds to the data of FIG. 6(D).

Figure 10:
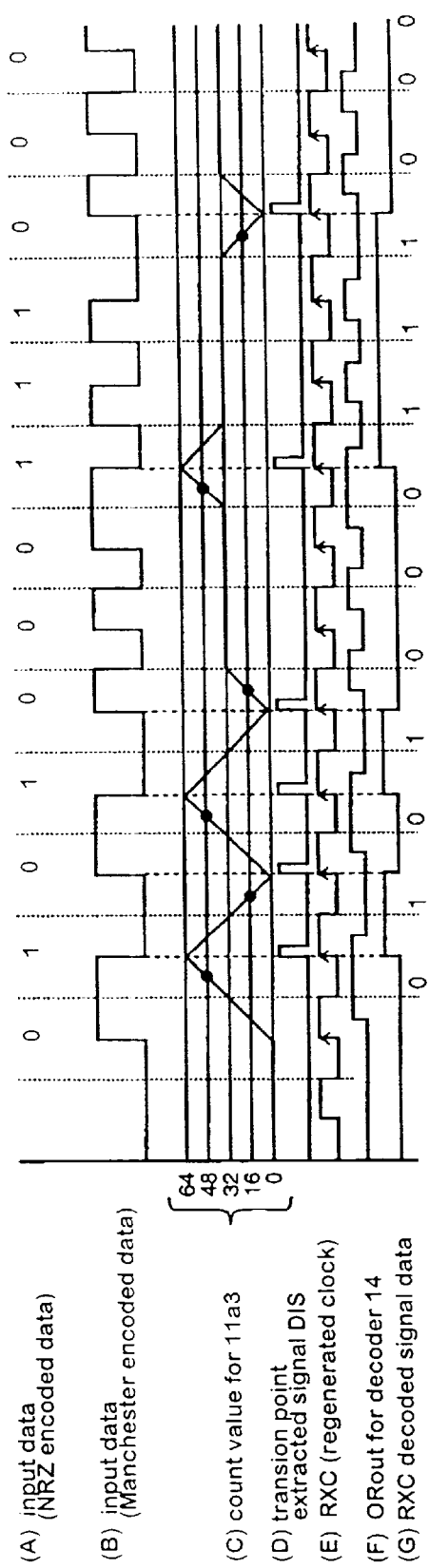
FIG. 10 is a timing chart showing a decoding operation occurring at a decoder of the embodiment of the present invention.

FIG. 10 is a timing chart showing a decoding operation occurring at the decoder of the first embodiment. FIG. 10(A) shows the input data and corresponds to the data of FIG. 6(A). FIG. 10(B) shows Manchester encoded data corresponding to the input data and corresponds to the data of FIG. 6(B). FIG. 10(C) shows the data for the count value of the up/down counter 11a3 and corresponds to the data for FIG. 6(C). FIG. 10(D) shows the data for the transition point extraction signal DIS of the output of transition point extractor 12 and corresponds to the data of FIG. 6(D). FIG. 10(E) shows data for the values of transition point-synchronized internal clock RXC of the decoder 14 and corresponds to the data of FIG. 6(F). FIG. 10(F) shows data for ORout of the decoder 14 and corresponds to the data of FIG. 6(G). FIG. 10(G) shows the decoded signal data RXD and corresponds to data of FIG. 6(H).

(a) Operation Occurring at Moving Average Circuit 11a (for Clock Component Extraction Use)

As shown in FIG. 3, the input data DEMO is inputted to the moving average circuit 11a of the moving average unit 11. The moving average circuit 11a compares the register value of the first stage of the shift register 11a1 and the register value of the 65th stage. When the two compared register values are different, the moving average circuit 11a has the up/down counter 11a3 count upwards or downwards. The up/down counter 11a3 decides to count upwards or downwards in response to the register value held in the first stage of the shift register 11a1.

As a result, the up/down counter 11a3 sequentially counts a number of 1's for a fixed time period. In the case of this embodiment, the number of 1's for a fixed time period is the number of 1's for one period of the received Manchester encoded data. This sequential count value is the transition average of the input data. The up/down counter 11a3 can then leave the frequency component (a pattern of alternate 0's and 1's) taken as the subject to be extracted over. The up/down counter 11a3 then removes the unnecessary frequency components (patterns of consecutive 0's or patterns of consecutive 1's).

FIG. 7 shows the operation of the up/down counter 11a3. FIG. 7 is an example of the case (a "0" level) where there is no beginning data in the input data DEMO. The input data is taken to start from a level "0"

(a-1) In the Case of Successive Alternate 0's and 1's in the Input Data

When input data (referred to as Manchester encoded data) consisting of a pattern of successive 0's and 1's (this pattern is referred to as the clock component) is inputted, the moving average circuit 11a carries out the following operation.

When the initial input data is "0", the up/down counter 11a3 (FIG. 3) does not carry out a count operation because the leading half of this section (between "a" and "b" of FIG. 7(C)) has a value the same as for one period previous. At the following half (between "b" and "c" in FIG. 7(C)) of the initial input data section, the register value of the first stage of the shift register 11a1 (FIG. 3) is different from the register value for the previous period and is therefore "1". The count operation of the up/down counter 11a3 (FIG. 3) is an operation for counting up to [32]d (where "d" means a decimal value) (point "c" in FIG. 7(C)).

Now for the case where the input data continuing on from the initial input data is "1". In this case, the register value for the first stage of the shift register 11a1 (FIG. 3) occurring at the leading half (between "c" and "d" of FIG. 7(C)) of the data section is different from the register value for one period previous. The up/down counter 11a3 (FIG. 3) then continues the count-up operation for the portion for up to [32]d and the count value occurring at time d becomes [64]d (between "c" and "d" in FIG. 7(C)). At the following half (between "d" and "e" in FIG. 7) of the data section the register value for the first stage of the shift register 11a1 (FIG. 3) is different from the register value of one period previous and the register value becomes "0". As the up/down counter 11a3 (FIG. 3) then changes the direction of counting, the up/down counter 11a3 then carries out a count down operation for the portion [32]d. As a result, the count value occurring at the time "e" (FIG. 7(C)) is [32]d.

Now for the case where the following input data is "0". In this case, the register value of the first stage of the shift register 11a1 (FIG. 3) occurring at the leading half (between "e" and "f" of FIG. 7) of the section for the data is a different value from the register value for one period previous. As the register value can be given as "0", the up/down counter 11a3 (FIG. 3) continues to count down for the portion [32]d, and the count value occurring at the time "f" (FIG. 7(C)) is [0]d. The register value for the first stage of the shift register 11a1 (FIG. 3) occurring at the following half (between "f" and "g" of FIG. 7) of the data section is then different from the register value of one period previous and the register value is changed over to "1". As a result, the up/down counter 11a3 (FIG. 3) changes over the count direction, and the up/down counter 11a3 again counts upwards for the portion [32]d. The count value occurring at time "g" (FIG. 7(C)) is then [32]d.

In the case where the input data is a pattern of successive alternate 0's and 1's, when the input data (Manchester encoded data) is "1", the moving average circuit 11a (FIG. 3) takes the maximum value [64] d at the transition point where the input data becomes "1. The moving average circuit 11a (FIG. 3) takes the minimum value [0]d at this transition point when the input data is "0".

In other words, when the input data changes from "0" to "1" (point d of FIG. 7(C): MAX value), the count operation of the up/down counter 11a3 (FIG. 3) returns to a down count from an up count. When the input data changes from "1" to "0" (point "f" of FIG. 7(C): MIN value), the count operation of the up/down counter 11a3 (FIG. 3) returns to counting up from counting down. This means that the point where the input data turns around coincides with the transition point of the Manchester encoded data.

In this embodiment, one period of the Manchester encoded data is [64] counts of the main clock MCLK. The maximum value appearing at the output of the up/down counter 11a3 (FIG. 3) should therefore be the original [64]d and the minimum value appearing at the output of the up/down counter 11a3 (FIG. 3) should be the original [0]d.

In reality, waveform deterioration and shifts in the duty cycle (cases where the ratio of 1's and 0's within one period of the Manchester encoded data are not the same) exist in the input data. The up/down counter 11a3 (FIG. 3) can therefore count in an erroneous manner due to increases or decreases in the count number caused by these shifts. When the maximum value (MAX value) and the minimum value (MIN value) of the count number are not limited, increases and decreases in the count number of the up/down counter 11a3 accumulate and the up/down counter 11a3 (FIG. 3) can no longer count correctly.

In order to eliminate erroneous counts, the up/down counter 11a3 (FIG. 3) relating to this embodiment suppresses counting up in excess of [64]d and counting down in excess of [0]d.

(a-2) When the Input Data is Continuous 0's or 1's

When the input data is a continuous pattern of 0's or 1's (refer to the continuous patterns of 0's or 1's of FIG. 7), the moving average circuit 11a operates as follows.

The operation of the moving average circuit 11a in the case of successive 0's is described with reference to between "h" to "n" of FIG. 7(C). In the case of successive 0's, the leading half of the initial "0" bit section (between "h" and "i" of FIG. 7(C)) is the point where the data changes (the point where the input data changes from "1" to "0"). In the case of consecutive 0's, the register value of the first stage of the shift register 11a1 (FIG. 3) is different to the register value for one period previous and the register value is [0]. The count operation for the up/down counter 11a3 (FIG. 3) is then counting down to [32]d. As a result, the count value occurring at the point "i" (FIG. 7(C)) is [0]d.

At the following half (between "i" and "j" in FIG. 7(C)) of the initial "0" bit section, the register value of the first stage of the shift register 11a1 (FIG. 3) is different from the register value for one period previous and the register value is therefore [1]. The count operation of the up/down counter 11a3 (FIG. 3) is then counting up of [32]d and the count value occurring at the time "j" (FIG. 7(C) is [32]d.

The procedure from 2nd bit of consecutive bits of "0" is as follows. At each of the sections of the leading half of bit "0" (between "j" and "k" of FIG. 7(C)), the following half (between "k" and "l " of FIG. 7(C)), the leading half (between l and m of FIG. 7(C)) and the following half (between "m" and "n" of FIG. 7(C)), the register value for the first stage of the shift register 11a1 (FIG. 3) is the same value as the register value for one period previous. The count operation is then temporarily interrupted. During this time, the count value is usually fixed at [32]d.

The operation of the moving average circuit 11a (FIG. 3) in the case of consecutive 1's is described with reference to between "n" to "t" of FIG. 7(C).

In the case of consecutive 1's, the leading half of the initial "1" bit section (between "n" and "o" of FIG. 7(C)) is the point where the data changes (where the input data changes from "0" to "1"). In the case of consecutive 1's, the register value of the first stage of the shift register 11a1 (FIG. 3) is different to the register value for one period previous and the register value is [1]. The count operation of the up/down counter 11a3 (FIG. 3) then counts up from [32]d to [64]d.

The register value of the first stage of the shift register 11a1 (FIG. 3) occurring at the following half (between "o " and "p" of FIG. 7(C)) of the first "1" bit section is different to the register value for one period previous and the register value becomes "0". As the count direction then changes over, the up/down counter 11a3 (FIG. 3) counts down by [32]d. As a result, the count value occurring at time "p" (FIG. 7(C)) is [32]d.

The procedure from 2nd bit of consecutive bits of "1" is as follows. At each of the sections of the leading half of a 1 bit section (between p"and "q" of FIG. 7(C)), the following half (between "q" and "r" of FIG. 7(C)), the leading half (between "r" and "s" of FIG. 7(C)) and the following half (between "s" and "t" of FIG. 7(C)), the register value for the first stage of the shift register 11a1 (FIG. 3) is the same value as the register value for one period previous. The count operation is then temporarily interrupted. During this temporary interruption, the count value is usually fixed at [32]d.

When the input data is a pattern of consecutive 0's or 1's, the value of the up/down counter 11a3 (FIG. 3) (transition average) is fixed at [32]d. The transition average value is then different from the case of a pattern of consecutive 0's or 1's. The value of the transition average is then linear in shape and the moving average value does not have a shape characterized by a triangular waveform that is convex at it's bottom and top.

For ease of description, the operation of the up/down counter 11a3 (FIG. 3) is described with the initial bit of a consecutive pattern of 0's or 1's included in a consecutive pattern. When the initial bit is 0, the bit one bit previous to the initial bit is "1" and the bit pattern is "10". When the initial bit is "1", the bit one bit previous to the initial bit is "0" and the bit pattern is "01". In reality, the initial bit of the bit pattern can be included in the case of consecutive alternate 0's and 1's.

The reason for including this bit pattern in the description for consecutive patterns is to describe the process for how the count value of the up/down counter 11a3 (FIG. 3) occurring at a bit pattern section takes the value of [32]d. In other words, this initial bit is for describing the occurrence of the turn-around point when the transition average for the clock component included in the data is obtained. The points o and u of FIG. 7(C) indicate that detection (the possibility that a turn-around occurs at a transition point) of the clock component ("01" and "10") included in the data is possible.

In this case, waveform deterioration and shifts in the duty cycle exist in the actual input data and these shifts cause the count value to increase or decrease. When a result of moving average a pattern of consecutive 0's or 1's does not coincide with [32]d, there are also cases where the transition shifting results can be obtained by taking the value for the previous and following moving average results. The transition average value has a [32]d margin from the maximum value [64]d and the minimum value [0] taken as extraction targets in processes thereafter. The value for moving average is then not influenced to decoded data by fluctuations as a result of this margin.

(a-3) Conclusion

The moving average results for the input data DEMO outputted from the moving average circuit 11a are as follows. When a pattern (clock component) where the input data is alternate 0's and 1's appears, the count value of the moving average results appears to turn around at the transition points of the Manchester encoded data. When the input data is a consecutive pattern of 0's or 1's, turn around points for the moving average results do not appear and the moving average results are a fixed value.

The moving average circuit 11a can be considered to be a type of low pass filter. When the Manchester encoded data is 1 Mbps, considering the input data as a frequency component, a repeating pattern (clock component) appearing alternately as 0's and 1's can be said to be 500 kHz. As a pattern of consecutive 0's or 1's can also be said to be 1 MHz, the operation of the moving average circuit 11a can be described as follows.

When the cut-off frequency fc of the moving average circuit 11a=433 kHz, the operation of the moving average circuit 11a is that of a low-pass filter of cut-off frequency 433 kHz and moving average is performed on the inputted waveform. Moving average results are a triangular waveform for a 500 kHz component constituting a pattern of consecutive alternate 0's and 1's. The apexes of this triangular waveform can then be said to appear as transition points within the Manchester encoded data. A 1 MHz component constituting a consecutive pattern of 0's or 1's is removed by a low pass filter and just the direct current component is outputted.

The moving average circuit 11a operates as one type of low pass filter. The moving average circuit 11a copes with deterioration in the input waveform and eliminates unnecessary frequency components so that just the clock component can be outputted.

Usual Manchester encoded data decoding devices require a synchronization bit for use in a regenerated clock prior to the data (the bit length changes depending on the system protocol). If the moving average circuit 11a is used, a Manchester encoded data decoding device can extract the clock component from that data even without a synchronization bit and the Manchester encoded data decoding device can therefore create a regenerated clock without a synchronization bit.

(b) Operation Occurring at the Moving Average Circuit 11b (for Data Component Extraction Use)

The operation (signal flow) of the moving average circuit 11b (FIG. 4) for extracting the data component and which operates in parallel with the moving average circuit 11a is described with reference to FIG. 8.

In FIG. 4, the moving average circuit 11b for extracting the data component compares a register value for the first stage and a register value for the 33rd stage of the shift register 11b. When the two compared values are different, the moving average circuit 11b counts upwards or counts downwards.

The up/down counter 11b3 decides whether to count up or to count down in response to the register value held in the first stage of the shift register 11b1.

As a result, the up/down counter 11b3 sequentially counts the number of 1's in a half period of the Manchester code and this count value is the transition average of the input data. The up/down counter 11b3 then leaves the frequency component taken as the extraction target as is. The up/down counter 11b3 can then eliminate unnecessary frequency components (deteriorated waveforms) other than the extraction target.

In other words, the up/down counter 11b3 transition averages a 1 Mbps Manchester code each half period in order to decode the Manchester encoded data constituting the input data to NRZ code. The up/down counter 11b3 is therefore suited to counting the "0" component and "1" component of the input waveform.

In the half period ([32]d count), the maximum value of the up/down counter 11b3 should be the original [32]d and the minimum value of the up/down counter 11b3 should be the original [0]d.

In reality, waveform deterioration and shifts in the duty cycle (where the ratio of "1" and "0" within one period of the Manchester encoded data is not equal) exist in the input data. It is therefore possible that the up/down counter 11a3 may count in an erroneous manner due to increases and decreases in the count number caused by these shifts.

In order to eliminate erroneous counting, the up/down counter 11b3 relating to this embodiment suppresses counts upwards of [32]d and counts downwards of [0]d. Outputs QD0 to QD5 of the up/down counter 11b3 are established to give a maximum value for this count of [32]d.

If the count value is greater than the center point [16]d, it can be understood that the data for a half period is "1". If the count value is less than the center point [16]d, the data for half a period can be understood to be "0". The center point [16]d can be given as [010000]b (where b is a binary number). The center point [16]d can be obtained from the result (ORout) of performing an OR operation on the value QD4 of the fifth bit of the output of the up/down counter 11b3 and the value QD5 of the sixth bit. At the current point, whether the result of the OR operation is that the data for the half period is "1" or "0" can be discerned from whether the count value is greater than or equal to the center point or not.

FIG. 8(C) shows the results of moving average when the input data is "0". The results of this moving average are that a minimum value [0]d is obtained at the transition point "a" for the Manchester encoded data for the input waveform. This transition point coincides with the center of the OR operation (ORout (FIG. 8(F)) output for discerning "1" or "0". FIG. 8(C) shows the results of the moving average for when the input data is "1". The results of this moving average take the maximum value [32] at the transition point "b" of the Manchester encoded data for the input waveform. This transition point coincides with the center of the OR operation (ORout(FIG. 8(F)) output for discerning "1" or "0".

When an internally regenerated clock is made, a clock regenerator regenerates a clock in synchronism with the transition points of the Manchester encoded data for the inputted waveform. The most stable point for the moving average output ORout (FIG. 8(F)) is extracted at the clock regenerator. In other words, the clock regenerator extracts the point constituting the most substantial margin. The data for the most stable point of the moving average output ORout (FIG. 8(F)) means the decoded data.

At the clock regeneration unit 13, the decoding device relating to this embodiment puts the internal clock in synchronism with the transition point extraction signal DIS extracted by the transition point extractor 12.

The decoding device relating to this embodiment is configured to give output as the transition point-synchronized internal clock RXC based on the synchronized internal clock.

(c) Operation of the Transition Point Extractor 12

The operation of the transition point extractor 12 is described in FIG. 5. When the input data is a pattern of successive alternate 0's and 1's (this pattern has a clock component), the transition point extractor 12 utilizes the characteristics of the output of the up/down counter 11a3 having turning points. The transition point extractor 12 produces the transition point extraction signal DIS for the Manchester encoded data constituting the input data by utilizing this characteristic.

When a clock component is included in the input data (i.e. for a repeating pattern of "01" or "10"), when the pattern for the input data is "01", the output of the moving average circuit 11a (FIG. 1) turns around at the maximum value [64]d. When the input data pattern is "10", the output of the moving average circuit 11a (FIG. 1) turns around at the minimum value [0]d. When there is no clock component, the output of the moving average circuit 11a (FIG. 1) is fixed at the center value [32]d.

The transition point extractor 12 adopts the following configuration for extracting transition points. The transition point extractor 12 decides cross points (each margin ±16 counts) based on the extracted transition points taking into consideration the margin with respect to errors in the count value due to waveform deterioration and processing time required for extraction.

FIG. 9 shows a timing chart for the transition point extractor. FIG. 9(C) shows input data cross points. When the input data is "01",the cross point is decided as [48]d (point "A" and point "C") constituting the center value of [32]d and [64]d. When the input data is "10", the cross point is decided as [16]d (point "B" and point "D") constituting the center value of [32]d and [0]d.

The transition point extractor 12 (FIG. 5) detects cross points. The point where [48]d crosses is referred to as 48CRS, and the point where [16]d crosses is referred to as 16CRS. At a count of 16 with 1 MHz clock from a detected point, i.e. at a point delayed by a phase of 90 degrees, the transition point extractor 12 (FIG. 5) makes the transition point extraction signal DIS rise.

Referring to FIG. 9(D), when a clock component is included in the input data, the transition point extractor 12 (FIG. 5) outputs the transition point extraction signal DIS. When a clock component is not included in the input data, the transition point extractor 12 (FIG. 5) does not output the transition point extraction signal DIS.

It is possible for errors to occur in counting the cross points due to waveform deterioration etc. in the input data. The adjuster 12*c* of the transition point extractor 12 (FIG. 5) counts the extent of shift (±α) of the maximum and minimum values of the output of the moving average circuit 11*a* (FIG. 1). The transition point extractor 12 (FIG. 5) then uses this shift to correct (16±α) the count number of the counter 12*b* and outputs the corrected value as the transition point extraction signal DIS.

(d) Operation of Clock Regeneration Unit 13

The clock regeneration unit 13 in FIG. 1 takes in the transition point extraction signal DIS from the transition point extractor 12 as input and compares the phase of the transition point extraction signal DIS and the regenerated clock. The clock regeneration unit 13 then corrects the phase difference of the regenerated clock to within a certain range based on this phase comparison and outputs the corrected regenerated clock as the transition point-synchronized internal clock RXC.

(e) Operation at the Decoder 14

FIG. 10 is a timing chart of the operation of the decoder 14. As described above, the decoder 14 (FIG. 1) discerns the value of the OR result ORout inputted from the moving average circuit 11*b* (FIG. 1) by utilizing the transition point-synchronized internal clock RXC supplied from the clock regeneration unit 13 (FIG. 1).

FIG. 10 shows that the decoder 14 is capable of accurately decoding (RXD output) Manchester encoded data. The result of the OR operation ORout (FIG. 10(F)) takes its most stable value at the transition points of the input data. The internally generated clock RXC synchronized to the transition point extraction signal DIS (FIG. 10(D)) for the input data is therefore discerned to have its most stable value at the transition points of the input data.

(A-4) Results

As describe above, as the present invention is provided with the moving average unit 11 at the input stage of the decoding device and just the required signal components are extracted and unnecessary signal components are eliminated. This embodiment can therefore be compatible with deterioration in the input waveform even in data transmission that employs poor line quality such as wireless propagation paths based on the required signal components.

This embodiment can execute a prescribed decoding operation by extracting transition points from input data. Therefore this embodiment eliminates the need for complicated circuitry required in the related art for confirming whether a clock extracted from input data is extracted as a clock which decodes the part of the leading half of the time slot or the part of the following half of the time slot. And this embodiment can carry out decoding with a simple circuit configuration.

With this embodiment the desired decoding operation can be executed if a clock component is included within the input data. Clock regeneration and decoding of Manchester encoded data is possible in this embodiment even if only the clock component appearing within the data is used. This embodiment therefore no longer requires a synchronization bit dedicated to clock regeneration to be provided directly before the data as was the case in the related art.

In this embodiment the frequency of the regenerated clock can be the same as the frequency of the input data and the doubled frequency required in the related art is no longer necessary. Current consumed by a system for regenerating the regenerated clock can therefore be kept small compared with the related art.

This embodiment takes the regenerated clock signal from the first low pass filter. The embodiment then takes in the binary level signal giving whether the filter output of the second low pass filter is larger than or smaller than a prescribed value based on the regenerated clock signal. The embodiment can then obtain NRZ encoded data corresponding to the inputted Manchester encoded data based on the taken in binary level signal. The device configuration for this embodiment is therefore small compared with the related art and is capable of decoding Manchester encoded data in a simple manner.

(B) Further Embodiment

In FIG. 5, the adjuster 12*c* provided at the transition point extractor 12 is an essential part of the configuration of the decoding device in the above embodiment. When a superior propagation path where the influence of waveform deterioration does not have to be considered can be used, the adjuster 12*c* does not have to be provided.

In the above embodiment, cross points used in the extraction of transition points are set at values of ¾ and ¼ of the maximum value, but it is also possible for different values to be adopted in the embodiment in response to the precision and processing performance etc. obtained in this system.

In FIG. 4, an OR circuit is provided as the output stage of the moving average circuit 11*b* for data extraction use in the above embodiment. In this embodiment, the output of the OR circuit can determine whether or not the data amplitude appearing at the count value of the up/down counter 11*b*3 is greater than half. The output of the OR circuit can, however, be configured from other means. For example, the output of the OR circuit can be a comparator set to half the amplitude of the subject of the comparison.

In the above embodiment a continuous decoding operation is carried out using hardware but the continuous decoding operation can also be carried out using software processing.

In the above, the present invention is described with reference to the preferred embodiments. It can be seen that various modifications and variations can be understood by one skilled in the art and that all such modifications and variations are included in the scope of the appended claims.

What is claimed is:

1. A Manchester encoded data decoding method comprising the steps of:

extracting a clock component from input data inputted at a prescribed rate;

taking the extracted clock component as input and extracting transition points from a signal waveform of the clock component;

generating a clock signal of the same rate as the input data, that is in synchronism with a phase of the extracted transition points;

extracting a data component from the input data;

outputting results of comparing the extracted data component and a prescribed value as a binary level signal; and outputting the binary level signal, taken in using the clock signal, as NRZ encoded data corresponding to the input data.

2. The Manchester encoded data decoding method of claim 1, wherein:

extracting of the clock component obtains a moving average value taken over one time slot of the input data; and extracting of the data component obtains a moving average value taken over a ½ time slot period of the input data.

3. The Manchester encoded data decoding method of claim 1, wherein the step of extracting the transition points includes correction of distortion in the extracted clock component.

4. A Manchester encoded data decoding device comprising:

a first low pass filter for extracting a clock component from input data inputted at a prescribed rate;

a transition extractor for taking the extracted clock component at input and extracting transition points from a signal waveform of the clock component;

a clock generator for generating a clock signal of the same rate as the input data, that is in synchronism with a phase of the extracted transition points;

a second low pass filter for extracting a data component from the input data;

an encoder for outputting results of comparing the extracted data component and a prescribed value as a binary level signal; and a decoder for outputting the binary level signal, taken in using the clock signal, as NRZ encoded data corresponding to the input data.

5. The Manchester encoded data decoding device of claim 4, wherein:

the first low pass filter obtains a moving average value taken over one time slot of the input data; and the second low pass filter obtains a moving average value taken over a ½ time slot period of the input data.

6. The Manchester encoded data decoding device of claim 4, wherein the transition point extractor includes a adjuster for correcting distortion in the extracted clock component.

7. A method for decoding encoded data, comprising:

extracting a clock component from input data input at a prescribed rate;

forming a signal waveform for the extracted clock component;

extracting transition points from the signal waveform;

generating a clock signal in phase with the extracted transition points and having the same rate as the input data;

extracting a data component from the input data;

comparing the extracted data component and a prescribed value to output a binary signal value; and decoding the binary signal value using the clock signal to obtain NRZ encoded data corresponding to the input data.

8. The method of claim 7, wherein the signal waveform is formed from a moving average value.

9. The method of claim 7, where the data component is obtained from a moving average value.

* * * * *

UNITED STATES PATENT AND TRADEMARK OFFICE
CERTIFICATE OF CORRECTION

PATENT NO.    : 6,370,212 B1
DATED         : April 9, 2002
INVENTOR(S)   : Junji Nakai and Yoshio Masuda It is certified that error appears in the above-identified patent and that said Letters Patent is hereby corrected as shown below:

<u>Title page,</u>
Item [75], should read as follows:

-- [75]   Inventor:        Junji Nakai, Tokyo (JP)
                           Yoshio Masuda, Tokyo (JP) --

Signed and Sealed this

Twenty-seventh Day of August, 2002

Attest:

JAMES E. ROGAN
*Attesting Officer*          *Director of the United States Patent and Trademark Office*